United States Patent
Price (12)

(10) Patent No.: US 6,278,601 B1
(45) Date of Patent: Aug. 21, 2001

(54) INFRARED SHIELD FOR CAPACITORS

(75) Inventor: Rick A Price, Forest, VA (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 08/780,060

(22) Filed: Dec. 23, 1996

Related U.S. Application Data

(63) Continuation of application No. 08/493,504, filed on Jun. 21, 1995, now abandoned.

(51) Int. Cl.$^7$ .................................................. H01G 2/00
(52) U.S. Cl. .................. 361/272; 361/274.1; 361/301.4; 361/311; 361/301.2
(58) Field of Search .................................. 361/272, 282, 361/301.1, 301.2, 301.4, 323, 307, 310–311, 313, 274.1, 301.5, 306.3, 321.1, 321.2; 219/85.13, 85.12, 25.42; 29/25.42

(56) References Cited

U.S. PATENT DOCUMENTS

| | | | |
|---|---|---|---|
| 3,592,992 | 7/1971 | Costello | 219/85 |
| 3,612,963 | 10/1971 | Piper | 317/261 |
| 3,718,800 | 2/1973 | Costello | 219/85 |
| 4,123,309 | * 10/1978 | Perrington et al. | 156/234 |
| 4,462,062 | 7/1984 | Rayburn | 361/323 |
| 4,481,708 | 11/1984 | Bokil et al. | 29/588 |
| 4,516,187 | 5/1985 | Lavene | 361/309 |
| 4,578,737 | 3/1986 | Westermann | 361/308 |
| 4,580,190 | 4/1986 | Rayburn | 361/310 |
| 4,603,373 | * 7/1986 | Lavene | 361/306 |
| 4,656,556 | 4/1987 | Westermann | 361/307 |
| 4,672,506 | 6/1987 | Deguchi et al. | 361/323 |
| 4,838,475 | 6/1989 | Mullins et al. | 228/179 |
| 4,927,068 | 5/1990 | Naka et al. | 228/103 |
| 5,196,667 | 3/1993 | Gammelin | 219/85.12 |
| 5,268,051 | * 12/1993 | Kent et al. | 156/62 |
| 5,371,650 | * 12/1994 | Lavene | 361/310 |

OTHER PUBLICATIONS

Thermal Component Shrouds from Research Disclosure Aug. 1991 No. 328.
IBM Technical Disclosure Bulletin vol. 20 No. 10 Mar. 1978.

* cited by examiner

*Primary Examiner*—Jeffrey Gaffin
*Assistant Examiner*—Phuong T. Vu
(74) *Attorney, Agent, or Firm*—Schwartz & Weinrieb

(57) ABSTRACT

A plastic film capacitor shield wherein the shield is secured to an outer surface of plastic film capacitor. The shield is sufficient to protect the plastic film capacitor from excessive radiant infrared energy during infrared reflow soldering which could damage the plastic film capacitor. The plastic film capacitor shield can be composed of many different materials such as electrical grade tape, electrical grade plastic, metal tape, or epoxy. The shield can be attached to the capacitor in various ways, which includes: securing a shield to an upper surface of the capacitor; having a shield on an upper and lower surface of the capacitor, wrapping and securing a shield to the plastic film capacitor on four sides of the capacitor; securing a shield on all sides of the capacitor; and securing a combination of different shields to the outer surfaces of the capacitor.

17 Claims, 1 Drawing Sheet

INFRARED SHIELD FOR CAPACITORS

This application is a continuation, of application Ser. No. 08/493,504, filed Jun. 21, 1995 now abandoned.

FIELD OF THE INVENTION

The present invention relates generally to a means by which components, and in particular plastic film capacitors, can be protected from damage when subjected to radiant infrared energy which is used for the purpose of reflowing solder on a printed circuit board.

BACKGROUND OF THE INVENTION

The primary means of attaching components to a printed circuit board has been to have holes formed within the circuit board through which the leads of the components could be placed and solder applied on the bottom side of the board where the leads egressed. The circuit board would then be passed through a solder wave in which the leads would be soldered to the circuit board.

Another method of attaching components to printed circuit boards is using surface mounting techniques wherein either the component is leadless or its leads are formed so that the component can be freestanding. Surface mounting techniques better automate the attachment of components to printed circuit boards since they improve reliability of attaching components to the circuit board and reduce the amount of area that needs to be used on a printed circuit board. When surface mounting, the solder is typically applied as a room temperature solder paste into which the component's terminals are placed and the board is then heated to a temperature at which the solder paste will reflow as liquid solder, thereby attaching the components to the printed circuit board.

The four typical methods by which reflow heat can be applied to a printed circuit board on a production basis are:

1. Conduction—the bottom surface of the board is heated with the heat passing through the board by conduction and reflowing the solder paste.

2. Vapor phase—a neutral liquid material is vaporized, the printed circuit board is placed in the vapor, the latent heat of the vapor is transferred to the board causing the solder paste to reflow and the vapor in transferring its heat returns to being a liquid for subsequent re-heating.

3. Convection—a heated gas, typically just air, but sometimes nitrogen, is gently directed at the printed circuit board and the solder paste is reflowed.

4. Infrared—radiant infrared energy is directed at the printed circuit board and the solder paste is reflowed.

Of the four different methods of surface mounting components, the infrared reflow method offers the highest volume production capability with respect to the cost of the equipment involved.

The primary disadvantage in using infrared reflow is that when components, such as plastic film capacitors, are subjected to radiant infrared energy at the levels being used to reflow solder on printed circuit boards, the components will absorb excessive amounts of energy to such a degree as to physically damage the components thereby causing the circuit board to work improperly. This has required the components to be mounted in a post assembly operation with the soldering being accomplished by conduction or convection heating.

Another disadvantage of using infrared reflow processing with plastic film capacitors is that the infrared radiant energy will typically heat the plastic film capacitors much faster than the joints that are to be soldered. The major reason for this is the higher absorption rate of the plastic film capacitor as compared with the materials forming the joint such as copper or tin.

DESCRIPTION OF THE PRIOR ART

A variety of methods and devices have been developed to protect electronic components from excessive heat associated with radiant infrared energy during infrared reflow soldering. One method suggests using reflective metallized polymeric caps for placement over thermally sensitive components, thereby providing thermal insulation to the components and reflecting part of the infrared radiation away from the components.

Another method suggests using a shroud that is made of molded high temperature plastic with a metal outer layer. The shroud is designed to fit over the component and can be snapped on and snapped off the circuit board Still another method shown in U.S. Pat. No. 4,838,475 discloses placing a metal box like structure over and around the component to be shielded. The metal box has a plurality of apertures formed therein to enable some infrared energy to pass through and reflow solder the device to the circuit board. Covering devices that are placed over the entire component are not cost effective since additional steps would be required in attaching and removing the cover from the circuit board before and after reflow soldering. Also, additional space would be required on the circuit board to allow the covers to be attached, thereby requiring a special design for the circuit board and also increasing the size of the circuit board.

These and other types of devices disclosed in the prior art do not offer the flexibility, cost effectiveness and inventive features of my infrared shielding device. As will be described in greater detail hereinafter, the infrared shielding device of the present invention differs from those previously proposed.

It therefore would be desirable to provide a simple and inexpensive means of protecting components from radiant infrared energy by utilizing a shield which is an integral part of the component rather than an external part of the component, thereby eliminating the need to take special precautions during infrared reflow soldering.

SUMMARY OF THE INVENTION

According to my present invention I have provided a plastic film capacitor shield, the shield being secured to an outer surface of a plastic film capacitor, the shield being sufficient to protect the plastic film capacitor from excessive radiant infrared energy during infrared reflow soldering which could damage the plastic film capacitor.

Another feature of my invention relates to the plastic film capacitor shield described above, wherein the plastic film capacitor shield is a material selected from the group consisting of electrical grade tape, electrical grade plastic, metal tape, and epoxy.

Yet another feature of my invention relates to the plastic film capacitor shield described above, wherein the plastic film capacitor is of a box type configuration having six sides, and the shield is secured to an upper surface of the plastic film capacitor. Various different types of shields can also be used and attached to the capacitor, this would include: having a shield on an upper and lower surface thereof; wrapping and securing a shield to the plastic film capacitor on four sides thereof; securing a shield on all six sides of the capacitor; and securing a combination of different shields to the outer surface of the capacitor.

Still another feature of my invention concerns a method of reflow soldering a plastic film capacitor to a substrate with infrared energy, which comprises the steps of: securing a capacitor shield to an outer surface of the plastic film capacitor; positioning the plastic film capacitor with the capacitor shield on the substrate; and exposing the plastic film capacitor with the capacitor shield to infrared energy, such that the infrared energy is substantially reflected away from the plastic film capacitor by the capacitor shield and the infrared energy causes the plastic film capacitor to be reflow soldered to the substrate.

DESCRIPTION OF THE DRAWINGS

Various objects, features and attendant advantages of the present invention will become more fully appreciated and more readily apparent from the following detailed description, when considered in connection with the accompanying drawings, in which like reference characters designate like or corresponding parts throughout the several views, and wherein.

DESCRIPTION OF THE PREFERRED EMBODIMENTS

Figure 1:
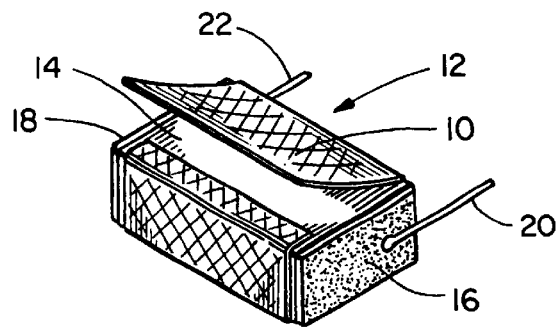
FIG. 1 is an enlarged perspective view of how my infrared shielding device is placed on capacitor.

The heat produced by radiant infrared energy is directly proportional to the exposed surface area of the component that is being radiated. The simplest way of protecting a component from thermal damage is to reduce the exposed area. Since the components themselves cannot be reduced in size, the amount of surface area that will absorb the radiant infrared energy must be reduced to protect components from thermal damage. This can be done by using materials with either high reflectivity and/or low absorptively to infrared frequencies ($\lambda > 7.8 \times 10^{-5}$ cm). A variety of materials can be used as the shield material. These materials can range from light colored plastics to highly reflective metals.

The concept behind the shield is to reduce the amount of exposed area on the component which would absorb the radiant infrared energy and thereby increase the component's internal temperature. The amount of protection necessary would be dependent on the frequency and duration of the radiant energy exposure. This means that the protection can be implemented from a simple decal placed on top of the component (reducing the exposed area by one-third) to totally wrapping the body of the component in shielding material (reducing the exposed area by over one-half). Another way of protecting components from excessive heat due to infrared radiation is to increase the thermal mass of the component by placing a coating having a low absorptivity to infrared energy on the component.

Although it may be considered to be on the opposite end of the frequency spectrum, the premise behind this invention is analogous to the use of sun screen (block) to prevent damage caused by ultra violet radiation from the sun. While materials such as zinc oxide are used in sun screen, highly reflective and/or low absorption materials such as bright aluminum or titanium dioxide (white pigment material) can be used to shield against infrared radiation. Just as different levels of protection are required with sun screen, so too are different levels of infrared shielding based on the thermal mass of both the circuit board and the component being protected as well as the wavelength of the infrared radiation and the exposure duration. Infrared reflow soldering ovens vary in the amount of time and temperature used to reflow circuit boards, therefore various amounts of protection can be used to protect components from the rigors of infrared reflow soldering.

Examples of the types of shielding that can be used, in increasing order of shielding effectivity are:

1. Blue conformal coating, 20–40 mils in thickness.
2. Gold conformal coating, 20–40 mils in thickness (ferrous oxide used as the pigment).
3. White electrical grade tape, 1 mil in thickness (titanium dioxide typically used as the pigment).
4. White electrical grade plastic, 3–10 mils in thickness (titanium dioxide typically used as the pigment).
5. Bright aluminum tape, 0.5 to 2 mils in thickness.

Excellent results are obtained when the blue and gold conformal coatings specified above are epoxy. The epoxy can be applied to the components using a reflowed powder. The conformal coating placed on the component provides a lower absorption to infrared energy and also helps to reflect infrared energy from the component. The infrared energy is reflected away from the component to a greater degree when the epoxy is lighter in color. A ferrous oxide is typically used to color the gold epoxy. The increased thermal mass of the component also helps to distribute the infrared energy throughout the component and the conformal coating, thereby decreasing the amount of heat that is passed to the component itself.

The white electrical grade tape and the white electrical grade plastic specified above helps to reflect infrared energy away from the component. Titanium dioxide is typically used as the pigment. This pigment further helps reflect radiant infrared energy from the components. A 1 mil thickness of the white tape and a 3–10 mil thickness of the white plastic is sufficient to help protect components from excessive thermal damage due to radiant infrared energy. The white tape and the white plastic can be thinner or thicker than described above, however, they must be thicker than the wavelength of the infrared energy used (that is $\lambda > 7.8 \times 10^{-5}$ cm) in order to shield and reflect infrared energy away from the capacitor. Excellent results are also obtained when the white electrical grade plastic specified above is a plastic sold under the trade name "Valox" by General Electric.

The bright aluminum tape provides the best protection since it can reflect more infrared energy from the component than the other shields. Many other metals can also be used as shields such as copper, tin, silver, etc., however, bright aluminum tape is commercially available and is also cost effective.

Tables I and II below are comparison tests done on unshielded and shielded capacitors that have undergone infrared solder reflow. It can be seen that the shielded capacitors maintain a much higher insulation resistance after infrared reflow soldering than the unshielded capacitors.

TABLE I

Capacitor Shielded With Aluminum Tape.

| | Unshielded Sample Averages | | | Shielded Sample Averages | | |
|---|---|---|---|---|---|---|
| | Initial | Final | %Δ | Initial | Final | %Δ |
| Capacitance Value | 0.4450 | 0.3885 | −12.70% | 0.4535 | 0.4416 | −2.62 |
| Percent Dissipation Factor | 0.515 | 0.515 | 0.00% | 0.520 | 0.530 | 1.92% |
| Insulation Resistance | 47,500 | 25,500 | −46.32% | 30,000 | 29,000 | −3.33% |

TABLE II

Capacitor Shielded With White Plastic (Valox).

| | Unshielded Sample Averages | | | Shielded Sample Averages | | |
|---|---|---|---|---|---|---|
| | Initial | Final | %Δ | Initial | Final | %Δ |
| Capacitance Value | 0.09451 | 0.09302 | −1.58% | 0.09346 | 0.09340 | −0.06% |
| Percent Dissipation Factor | 0.432 | 0.412 | −4.63 | 0.413 | 0.396 | −4.12 |
| Insulation Resistance | 60,400 | 28,569 | −52.70% | 71,600 | 65,600 | −8.38% |

Figure 2:
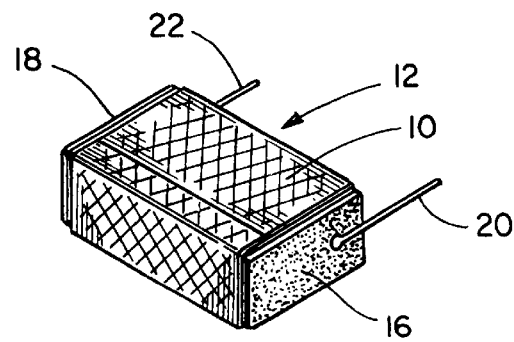
FIG. 2 is an enlarged perspective view of one embodiment of my infrared shielding device embodying important features of my invention.

Referring now to the drawings, FIGS. 1 and 2 show my new and improved infrared shielding device 10 mounted on a plastic film chip capacitor 12. FIG. 1 further illustrates how my shield 10 is wrapped around the body of the plastic film chip capacitor 12. The shield 10 can be secured to the plastic film capacitor 12 using an adhesive. Many different kinds of adhesives could be used such as silicone, acrylic or rubber. If the shield is made of an electrically conductive material, such as aluminum, it is essential that the shield 10 is wrapped on top of the plastic film portion 14 (or non-conductive portion) of the capacitor 12 and is not touching the terminals 16, 18 or the leads 20, 22 of the capacitor 12 since this may cause the capacitor 12 to short out. Using a non-conductive adhesive on the shield 10 would help prevent shorting of the capacitor 12 if the shield 10 was touching the opposing terminals 16, 18 on the capacitor 12.

Figure 3:
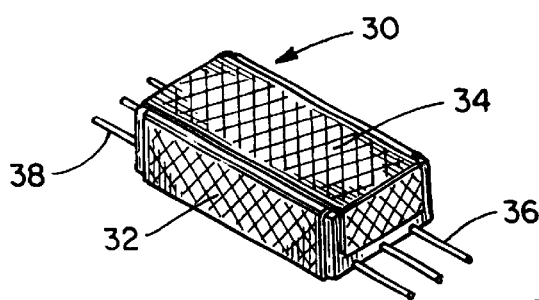
FIG. 3 is an enlarged perspective view of another embodiment of my infrared shielding device.

FIG. 3 illustrates another way of shielding a capacitor. The capacitor 30 is wrapped and adhesively secured with a shield 32 on at least three sides, and a second shield 34 is adhesively secured to cover the remaining sides not shielded by shield 32 thereby providing a protective shield on all six sides of the plastic film chip capacitor 30. If the shields 32, 34 are made of an electrically conductive material, it is essential that the shields 32, 34 do not touch the leads 36, 38 of the capacitor 30 or any other electrically conductive part of the capacitor 12 since this may cause the capacitor 12 to work improperly. It is possible to have a single shield specifically cut to size that would cover all six sides of the capacitor 30, however, this may not be cost effective.

Figure 4:
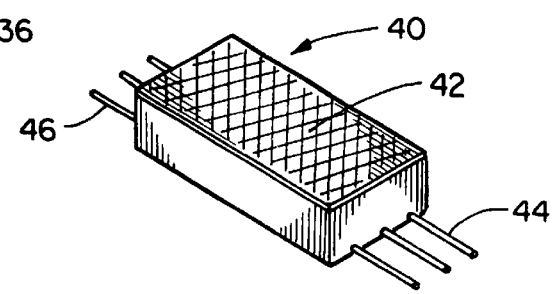
FIG. 4 is an enlarged perspective view of yet another embodiment of my infrared shielding device.

FIG. 4 illustrates yet another way of shielding a capacitor. The plastic film capacitor 40 has a shield 42 adhesively attached only to the top surface of the capacitor 40. If the shield 42 is an electrically conductive material, then it is necessary that the shield 42 is positioned in such a manner that it cannot short out the capacitor 40.

Figure 5:
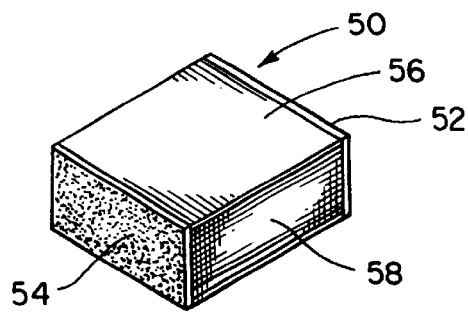
FIG. 5 is an enlarged perspective view of a further embodiment of my infrared shielding device.

Another method of shielding a capacitor is illustrated in FIG. 5. The plastic film chip capacitor 50 having two terminal ends 52, 54 without leads is shielded with a white electrical grade plastic 56, 58 on opposing sides of the capacitor 50. The plastic 56, 58 is positioned between the terminal ends 52, 54 of the capacitor 50. Excellent results are obtained when the plastic 56, 58 is laminated to the sides of the capacitor 50.

Figure 6:
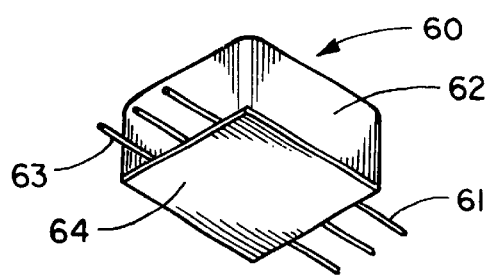
FIG. 6 is an enlarged perspective view of another embodiment of my infrared shielding device embodying important features of my invention.

Still another method of shielding a capacitor from radiant infrared energy is shown in FIG. 6. The plastic film capacitor 60 having opposing leads 61, 63 is coated with epoxy 62 on five sides thereof to provide a shield. The capacitor 60 can further include an additional shield 64, such as a white electrical grade tape, secured to the sixth side of the capacitor 60 not shielded by epoxy 62, thereby shielding all six sides of the capacitor 60.

Shielding all six sides of the capacitor provides the greatest protection during infrared solder reflow. Even though the bottom side of the capacitor may not be directly exposed to the radiant infrared energy, it can be exposed to radiant infrared energy that is reflected from the circuit board and/or components on the circuit board.

The shielded capacitors illustrated in the figures can be with or without leads depending on their required application. Additionally, the shielded capacitor can be of a chip type construction or of a rolled or wound type construction. It is preferred to use the described shielding devices and methods on a chip type capacitor, however, excellent results can also be obtained by using the described shielding devices and methods on a rolled or wound type capacitor.

Once the plastic film capacitor has been shielded, the capacitor can then be placed on a printed circuit board and exposed with radiant infrared energy to attach the capacitor to the circuit board using reflow soldering.

Modifications and variations of the present invention are possible in light of the above teachings. It therefore is to be understood that within the scope of the appended claims, the invention may be practiced otherwise than as specifically described.

What is claimed and desired to be secured by Letters Patent is:

1. A plastic film capacitor, comprising:
    a plastic film capacitor having a plurality of outer surface portions wherein one of said outer surface portions comprises means for surface mounting said plastic film capacitor to a substrate by reflow soldering techniques; and
    an infrared energy reflective tape integrally secured to at least the top outer surface portion of said plastic film capacitor so as to protect said plastic film capacitor against infrared energy, when said plastic film capacitor is placed for surface mounted securement upon said substrate, by remaining secured to said at least top outer surface portion of said plastic film capacitor throughout the process of securing said plastic film capacitor to said substrate by said reflow soldering techniques,
    said infrared energy reflective tape comprising a high reflectivity and/or low absorptivity material relative to infrared energy having wavelengths which are greater than $7.8 \times 10^{-5}$ cm so as to protect said plastic film capacitor from excessive radiant infrared energy, which is generated attendant infrared reflow soldering of said plastic film capacitor to said substrate and which could damage said plastic film capacitor, by reflecting a first predetermined amount of said infrared energy away from said plastic film capacitor while permitting a second predetermined amount of said infrared energy to impinge upon said plastic film capacitor so as to cause said reflow soldering of said plastic film capacitor to said substrate.

2. The plastic film capacitor of claim 1, wherein said tape contains titanium dioxide and is white in color.

3. The plastic film capacitor of claim 1, wherein said tape is metallic.

4. The plastic film capacitor of claim 3, wherein said metallic tape is a bright aluminum.

5. The plastic film capacitor of claim 1, wherein said plastic film capacitor is a chip capacitor.

6. The plastic film capacitor of claim 1, wherein said plastic film capacitor is of a box type configuration having six sides, and said tape is secured to an upper surface of the plastic film capacitor.

7. The plastic film capacitor of claim 6, wherein said tape is secured to an upper and lower surface of the plastic film capacitor.

8. The plastic film capacitor of claim 6, wherein said tape is wrapped around and secured to the plastic film capacitor on four sides thereof in addition to the upper surface.

9. A method of reflow soldering a plastic film capacitor to a substrate by exposing said plastic film capacitor to infrared energy, comprising the steps of:

providing a plastic film capacitor having a plurality of outer surface portions wherein one of said outer surface portions comprises means for surface mounting said plastic film capacitor to a substrate by reflow soldering techniques;

integrally securing an infrared energy reflective tape, comprising a material which has high reflectivity and/or low absorptivity with respect to infrared energy having a wavelength which is greater than $7.8 \times 10^{-5}$ cm, to at least the top surface portion of said plastic film capacitor so as to protect said plastic film capacitor against infrared energy by remaining secured to said at least top surface portion of said plastic film capacitor throughout the process of securing said plastic film capacitor to said substrate by said reflow soldering techniques;

surface mounting said plastic film capacitor, with said integral infrared energy reflective tape secured thereon, upon said substrate; and exposing said plastic film capacitor, with said integral infrared energy reflective tape secured thereon, to infrared energy such that a first predetermined amount of said infrared energy is reflected away from said plastic film capacitor by said integral infrared energy reflective tape while a second predetermined amount of said infrared energy is permitted to impinge upon said plastic film capacitor so as to cause said plastic film capacitor to be reflow soldered to said substrate.

10. The method as set forth in claim 9, further comprising the steps of:

providing a plastic film capacitor which has the configuration of a rectangular solid having six side surfaces; and integrally securing an infrared energy reflecive tape upon all six side surfaces of said plastic film capacitor.

11. The method as set forth in claim 10, further comprising the step of:

integrally securing a first infrared energy reflective tape upon three of said six side surfaces of said plastic film capacitor; and integrally securing a second infrared energy reflective tape, separate, distinct, and different from said first infrared energy reflective tape, upon the remaining three side surfaces of said plastic film capacitor.

12. The method as set forth in claim 9, further comprising the steps of:

providing a plastic film capacitor which has the configuration of a rectangular solid having four side surfaces and two end surfaces; and integrally securing an infrared energy reflective tape only upon said four side surfaces of said plastic film capacitor.

13. A plastic film capacitor, comprising:

a plastic film capacitor having a plurality of outer surface portions wherein one of said outer surface portions comprises means for surface mounting said plastic film capacitor to a substrate by reflow soldering techniques; and an infrared energy reflective tape, comprising a high reflectivity and/or low absorptivity material relative to infrared energy having wavelengths which are greater than $7.8 \times 10^{-5}$ cm and integrally secured to at least a top outer surface portion of said plastic film capacitor when said plastic film capacitor is surface mounted upon said substrate, so as to protect said plastic film capacitor from excessive radiant infrared energy, attendant infrared reflow soldering of said plastic film capacitor to said substrate and which could damage said plastic film capacitor, by remaining secured to said at least top outer surface portion of said plastic film capacitor throughout the process of securing said plastic film capacitor to said substrate by said reflow soldering techniques and reflecting a first predetermined amount of said infrared energy away from said plastic film capacitor while permitting a second predetermined amount of said infrared energy to impinge upon said plastic film capacitor so as to cause said reflow soldering of said plastic film capacitor to said substrate.

14. A plastic film capacitor as set forth in claim 13, wherein:

said plastic film capacitor has the configuration of a rectangular solid having six side surfaces; and said infrared energy reflective tape is integrally secured to all six side surfaces of said plastic film capacitor.

15. A plastic film capacitor as set forth in claim 14, wherein:

a first infrared energy reflective tape is integrally secured upon three of said six side surfaces of said plastic film capacitor; and a second infrared energy reflective tape, separate, distinct, and different from said first infrared energy reflective tape, is integrally secured upon the remaining three side surfaces of said plastic film capacitor.

16. A plastic film capacitor as set forth in claim 13, wherein:

said plastic film capacitor has the configuration of a rectangular solid having four side surfaces and two end surfaces; and said infrared energy reflective tape is integrally secured only upon said four side surfaces of said plastic film capacitor.

17. A plastic film capacitor as set forth in claim 13, wherein:

said reflective tape is secured to said at least outer top surface portion of said plastic film capacitor by an adhesive.

* * * * *